US008666205B2

(12) United States Patent
Takizawa et al.

(10) Patent No.: US 8,666,205 B2
(45) Date of Patent: Mar. 4, 2014

(54) OPTICAL DEVICE

(75) Inventors: Toru Takizawa, Masashimurayama (JP); Takaaki Nozaki, Iruma (JP); Yosuke Abe, Fuchu (JP)

(73) Assignee: Citizen Holdings Co., Ltd., Tokyo (JP)

( * ) Notice: Subject to any disclaimer, the term of this patent is extended or adjusted under 35 U.S.C. 154(b) by 96 days.

(21) Appl. No.: 13/511,830

(22) PCT Filed: Nov. 24, 2010

(86) PCT No.: PCT/JP2010/070943
§ 371 (c)(1),
(2), (4) Date: May 24, 2012

(87) PCT Pub. No.: WO2011/065384
PCT Pub. Date: Jun. 3, 2011

(65) Prior Publication Data
US 2012/0243825 A1    Sep. 27, 2012

(30) Foreign Application Priority Data
Nov. 25, 2009  (JP) ................................ 2009-267285

(51) Int. Cl.
*G02B 6/12*    (2006.01)
(52) U.S. Cl.
USPC .......................................................... 385/14
(58) Field of Classification Search
None
See application file for complete search history.

(56) References Cited

U.S. PATENT DOCUMENTS

| 8,515,219 B2 * | 8/2013 | Abe et al. ......................... 385/14 |
| 2004/0264836 A1 * | 12/2004 | Kawashima et al. ............ 385/14 |
| 2008/0187014 A1 | 8/2008 | Takagi et al. |
| 2010/0247021 A1 * | 9/2010 | Cunningham et al. ............ 385/1 |
| 2010/0247022 A1 * | 9/2010 | Li et al. .............................. 385/1 |
| 2011/0194572 A1 * | 8/2011 | Yamazaki et al. ................. 372/6 |
| 2011/0235962 A1 * | 9/2011 | Shubin et al. .................... 385/14 |
| 2011/0280512 A1 * | 11/2011 | Abe et al. ......................... 385/14 |

FOREIGN PATENT DOCUMENTS

| EP | 0 962 809 A2 | 12/1999 |
| JP | 11-326966 A | 11/1999 |
| JP | 2001-100054 A | 4/2001 |
| JP | 2001-147335 A | 5/2001 |
| JP | 2008-192873 A | 8/2008 |

* cited by examiner

*Primary Examiner* — Sung Pak
(74) *Attorney, Agent, or Firm* — Sughrue Mion, PLLC

(57) ABSTRACT

An optical device (20) are formed by bonding a optical element (6) having an optical waveguide (8) with a substrate (2). On a surface of the optical element (6) facing the substrate (2) formed are the optical waveguide (8) and a thin film heater (4) that heats the optical waveguide (8). The optical element (6) and the substrate (2) are bonded through a first bonding part (12) and a second bonding part (14) made of metal material. The thin film heater (4) is electrically connected with a wire on the substrate (2) through the first bonding part (12) and the second bonding part (14). In this way, additional wires for electrical connection can be omitted, the optical element 6 can be miniaturized removing a superfluous region, and the manufacturing process can be simplified.

18 Claims, 13 Drawing Sheets

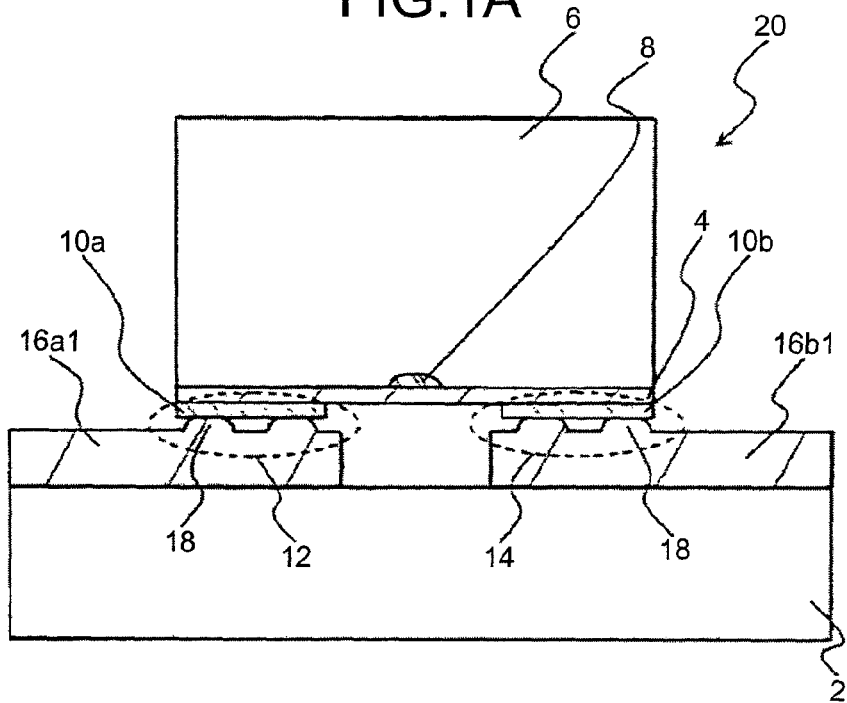
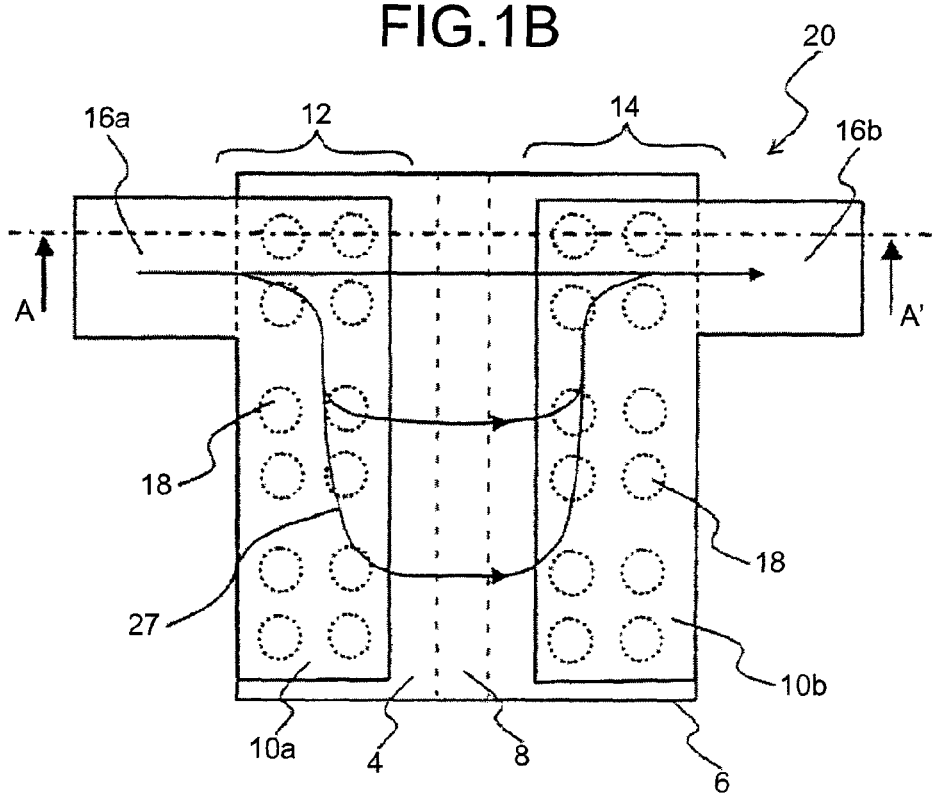

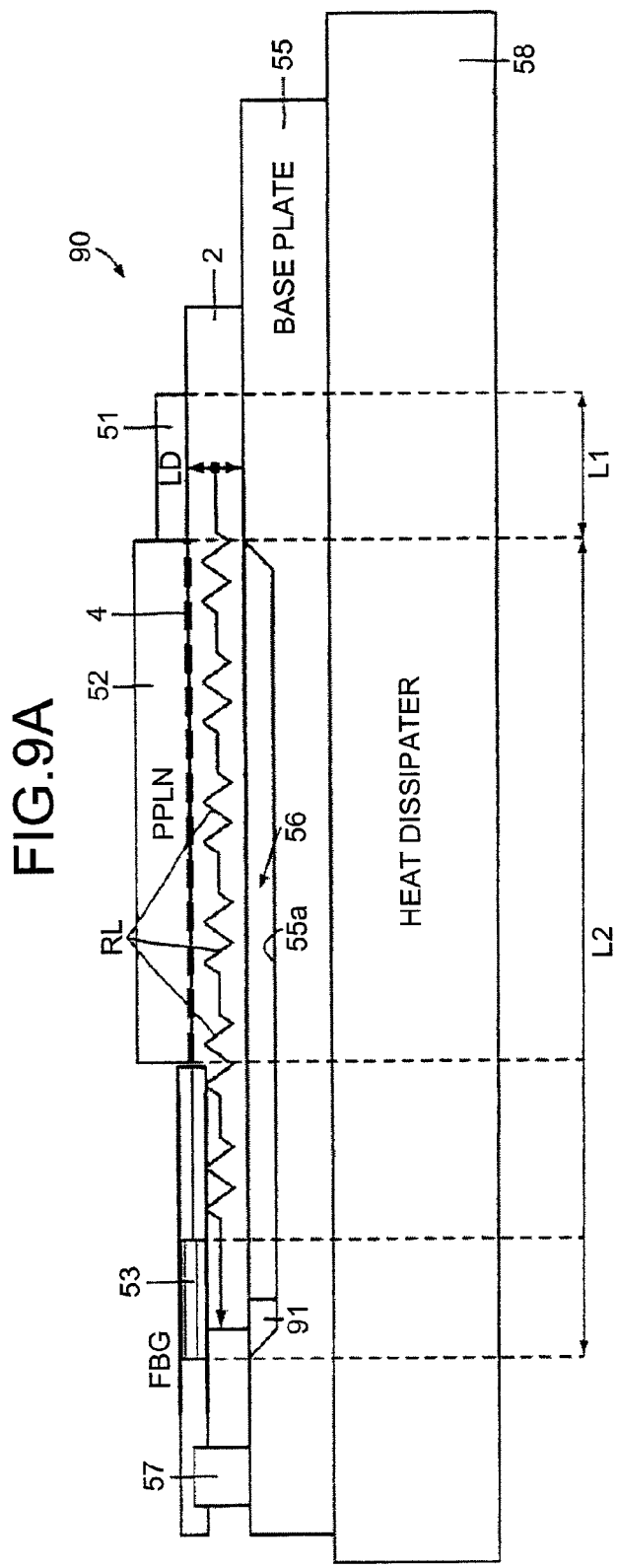

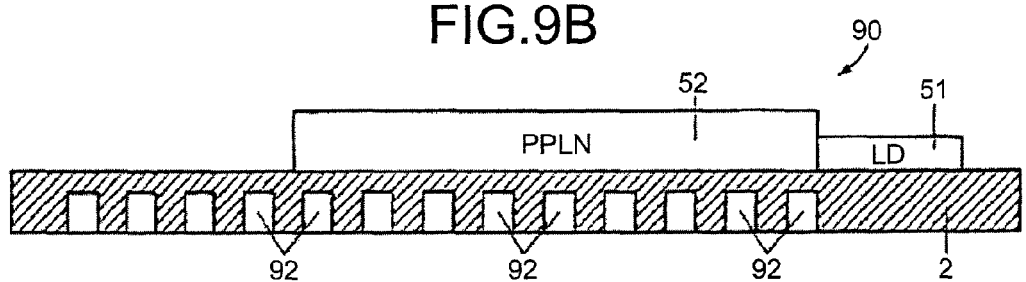
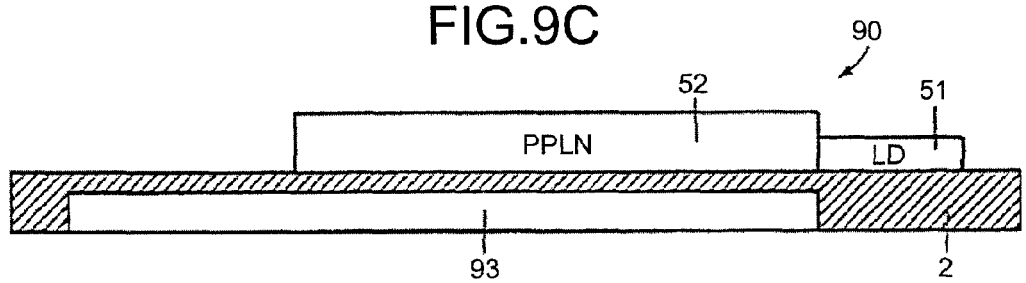
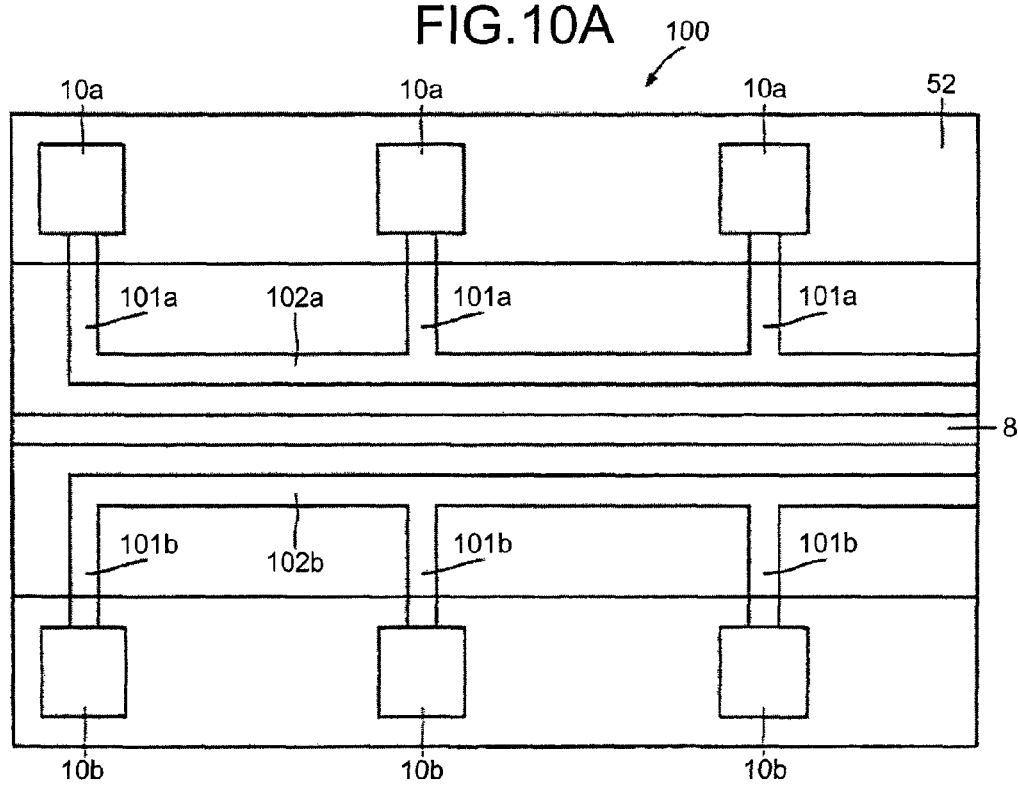

OPTICAL DEVICE

TECHNICAL FIELD

The embodiments discussed herein are related to an optical device in which an optical element having an optical waveguide and a substrate are bonded.

BACKGROUND ART

An optical waveguide formed in, for example, an optical element is a structure that confines light within the optical waveguide and leads the light to a destination depending on the difference in refractive indexes of a guide portion and a surrounding portion. Materials used for an optical waveguide have a large refractive index and are influenced by thermal expansion or the thermo-optic effect such that the size or the refractive index is changed. For this reason, a measure to keep the optical waveguide at a constant temperature is generally taken.

An optical element having an optical waveguide, especially a second-harmonic generator, is made of a crystalline material such as lithium niobate ($LiNbO_3$: LN) and lithium tantalite ($LiTaO_3$: LT). The crystalline material is periodically poled for having a wavelength conversion function. This element is often combined with a laser diode (LD). The poling frequency depends on a wavelength to be converted and thus when the poling frequency becomes shorter or longer due to the temperature, the wavelength conversion efficiency degrades.

Thus a temperature control for keeping the optical waveguide at a constant temperature is adopted. For example, Patent Document 1 discloses that a thin film heater is formed on an optical waveguide and warms the optical waveguide so that the temperature of the optical waveguide is kept constant irrelevant of surrounding conditions and the wavelength conversion efficiency of the second-harmonic generator does not degrade.

Patent Document 1: Japanese Patent Application Laid-Open Publication No. 11-326966 (page 6, FIG. 1)

DISCLOSURE OF INVENTION

Problem to be Solved by the Invention

However, the above explained conventional technique has problems described below. Generally, a thin film heater is made up of a conductive film formed on an optical element. Current flows through the conductive film and heats the optical waveguide for the temperature control. Thus electrodes need be formed on the optical element and wirings are also needed to supply current to the thin film heater.

In addition, the optical element is mounted on a substrate. Thus an area for the mounting of the optical element is required on the optical element. As a result, according to conventional techniques, a large surface area of the optical element is required even though the crystalline materials used for the optical element are expensive. Furthermore, processes for the mounting of the optical element and for the electrical connecting of the thin film heater become complicated according to the conventional techniques.

The present application aims to solve the above problems, downsizing a device by removing a superfluous area on an optical element and simplifying a manufacturing process of the optical device.

Means for Solving Problem

To solve the problems above, an optical device according to the present invention includes features below.

In an optical device in which an optical element having an optical waveguide is bonded with a substrate, the optical waveguide and a thin film heater that heats the optical waveguide are formed on a surface of an optical element facing the substrate, the optical element and the substrate are bonded through a first bonding part and a second bonding part made up of metal, a wire on the substrate is electrically connected with the thin film heater through the first bonding part and the second bonding part, and the fist bonding part and the second bonding part are located on both sides of the optical waveguide. These first and second bonding parts are bonding part between the optical element and the substrate and also are electrical bonding part for supplying current to the thin film heater.

In addition to the above features, a first electrode and a second electrode are formed on the thin film heater, and a first metal wire and a second metal wire are formed on the substrate. The first bonding part includes the first electrode and the first metal wire, and the second bonding part includes the second electrode and the second metal wire.

In addition to the above features, the optical device includes a plurality of first electrodes, a plurality of second electrodes, a plurality of first metal wires, and a plurality of second metal wires. The first bonding part includes the first electrodes and the first metal wires, and the second bonding part includes the second electrodes and the second metal wires.

In addition to the above features, a plurality of thin film heaters are formed on the optical element, and either the first electrode or the second electrode is formed on each thin film heater. When there are only one first bonding part and one second bonding part, current is supplied through these two points. Namely, current is supplied to the entire thin film heater but not to a desired area. However, multiple first and second bonding parts enable temperature control in a desired area supplying current from a predetermined external point.

In addition to the above features, the metal forming the first bonding part and the second bonding part is Au. Metal junction of Au and Au enables electrical connection.

In addition to the above features, the first and second bonding parts include a micro-bump. A micro-bump provides point-to-point bonding instead of face-to-face bonding. Thus clean surface of metal needed for metal bonding is easily obtained, facilitating the bonding.

In addition to the above features, the substrate and the optical element are bonded by surface activated bonding through the bonding part. The bonding method enables the bonding at a low temperature instead of heat-adding bonding such as the junction between Au and Sn.

In addition to the above features, the thin film heater is made up of a transparent electrode. When only a function of a thin film heater is considered, it may seem that a transparent electrode is not needed. However, since an optical waveguide runs near the thin film heater, the thin film heater absorbs energy of intensive light such as laser passing the optical waveguide and is damaged if the thin film heater is not transparent against such light.

In addition to the above features, the thin film heater is made up of a film of indium tin oxide, zinc oxide, tin oxide, or impurity-doped zinc oxide or tin oxide.

In addition to the above features, the optical element is a wavelength conversion element that converts wavelength of light passing through the optical waveguide. For instance, a second harmonic generation (SHG) element may be used as a wavelength conversion element with laser having the wavelength in the near-infrared.

The optical device includes a base substrate that is made of material of high heat conductivity and on which the substrate is mounted. The substrate includes a laser diode, an optical waveguide that guides light emitted from the laser diode, a wavelength conversion element that converts wavelength of light passing through the optical waveguide, and a fiber bragg grating, arranged in a direction of the optical axis of the optical waveguide. The base substrate is bonded with the substrate partially where the laser diode is mounted. Space is formed between the base substrate and the substrate corresponding to position of the wavelength conversion element and the fiber bragg grating. A support having high heat conductivity supports the fiber bragg grating, supporting the substrate. As can be seen, only part of the substrate, corresponding to the location of the laser diode, is bonded with the base substrate. As a result, heat from the laser diode can efficiently be released to the base substrate. Furthermore, the wavelength conversion element and the fiber bragg grating are scarcely influenced by heat of the laser diode because of the space.

The first electrode and the second electrode are located on both ends of the wavelength conversion element respectively with respect to the optical waveguide. As a result, thermal resistance for the optical waveguide located at a center part is increased.

The substrate includes an oxide film having a given height at a position corresponding to the first metal wire and the second metal wire, expanding space between the substrate and the wavelength conversion element. As a result, the substrate and the optical element are more apart from each other, lowering the heat conductivity.

The substrate includes a porous part at a position corresponding to the first metal wire and the second metal wire, reducing heat conductivity.

A plurality of first electrodes and second electrodes are arranged along the optical waveguide. An inrush prevention wall is disposed between the first electrodes and between the second electrodes, is made of the same material as the first electrodes and the second electrodes, and is electrically isolated from the first electrodes and the second electrodes. The inrush prevention wall prevents inrush of adhesive that fixes the wavelength conversion element to the substrate. As a result, even though the dividing of electrodes reduces an area bonded with the substrate, adhesive helps bonding of the optical element and the inrush prevention wall prevents the inrush of the adhesive.

A bottom surface of the substrate includes trenches that do not penetrate the substrate. Multiple trenches can heighten the thermal resistance.

A bottom surface of the substrate includes a low portion formed by hollowing out the substrate with brim of the substrate left. The hollow can heighten the thermal resistance.

The wavelength conversion element includes a heater arranged in parallel with the optical waveguide, and a connector that connects the first electrode and the second electrode with the heater. The connector is made of the same material as the first electrode and the second electrode. The first electrode and the second electrode are connected with the first metal wire and the second metal wire respectively. The first electrode and the second electrode are used as an electrode for the heater. As a result, a heater along the optical waveguide enables the temperature control of the optical waveguide and eliminates the necessity of additional electrodes for a heater.

Effect of the Invention

A substrate and an optical element can be bonded through a bonding part made of metal material, and a thin film heater is electrically connected through the bonding part. The structure eliminates the necessity of additional wires, reduces superfluous region on the optical element miniaturizing the optical element, and simplifies the manufacturing process.

BRIEF DESCRIPTION OF DRAWINGS

FIG. 1A is a diagram depicting a configuration of an optical device of Embodiment 1;

FIG. 1B is a diagram depicting a configuration of an optical device of Embodiment 1;

FIG. 9A is a front view of an optical device according to Embodiment 6;

FIG. 9B is a front view of another optical device according to Embodiment 6;

FIG. 9C is a front view of another optical device according to Embodiment 6;

FIG. 10A is a plan view of a heater;

BEST MODE(S) FOR CARRYING OUT THE INVENTION

Figure 2A:
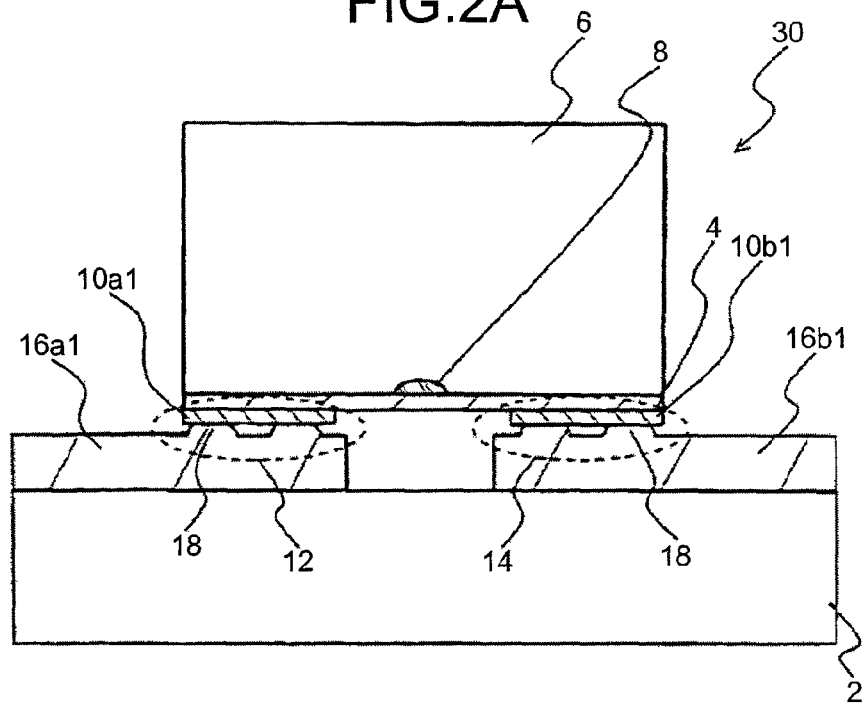
FIG. 2A is a diagram depicting a configuration of an optical device according to Embodiment 2.

Referring to the accompanying drawings, embodiments will be described in detail.

Embodiment 1

FIGS. 1A, 1B

An optical device according to Embodiment 1 is explained. FIGS. 1A and 1B are diagrams depicting a configuration of an optical device 20 of Embodiment 1. FIG. 1A is a section view of the optical device 20. FIG. 1B is a plan view of the optical device 20, looking at the optical device 20 from below, from the bottom in FIG. 1A. For simplicity, FIG. 1B only depicts part of elements of the optical device 20. FIG. 1A is a section view along a line A-A' of FIG. 1B.

As depicted in FIGS. 1A and 1B, in the optical device 20 of Embodiment 1, an optical element 6 having an optical waveguide 8 is bonded to a substrate 2. Each element is explained in detail below.

As depicted in FIGS. 1A and 1B, the optical waveguide 8 is formed on a face of the optical element 6 facing the substrate 2. The optical element is made of, for example, Lithium Niobate (LN), $LiNbO_3$. For LN, the proton exchange (PE) method is often used.

The optical element made of $LiNbO_3$ is dipped in pyrophosphoric acid with an opened region on which the PE method is performed (on which an optical waveguide is formed). Li in $LiNbO_3$ exchanges ions with a proton in pyrophosphoric acid. Annealing follows the ion exchange so that optical properties are stabilized. The shape of the region for the ion exchange is determined by the width of the opening, the time for the annealing and so on. The optical waveguide 8 formed in this way has a higher refractive index than $LiNbO_3$ around and guides light more easily.

When the optical element 6 serves as a wavelength conversion element, a poling region is formed in the optical waveguide 8 in order to convert the wavelength of light entering from one end of the element as a fundamental wave. The poling region is made up of regions where the polarization of $LiNbO_3$ is alternately flipped by 180 degrees with a certain period. The cycle is designed considering wavelength or ambient temperature, being the order of $10^{-6}$ m (μm). The polarization is inverted 180 degrees to form the poling region. Some methods for inverting the polarization is known, one of which is the inversion of the polarization under a high electric field.

As depicted in FIGS. 1A and 1B, on the surface on which the optical waveguide 8 has been fabricated, formed is a transparent conductive film as a thin film heater 4. For the transparent conductive film, an indium tin oxide (ITO) film may be used. The transparent conductive film is transparent for light guided through the optical waveguide 8 and thus even if light of high intensity goes through the optical waveguide 8, the destruction of the thin film heater 4 due to the absorption of the high intensity light can be avoided. Instead of an ITO film, zinc oxide (ZnO), tin oxide, or impurity-doped zinc oxide or tin oxide may be used for a film working as effectively as the ITO film.

As depicted in FIGS. 1A and 1B, on the thin film heater 4, a first electrode 10a is formed on one side and a second electrode 10b is formed on the other side with respect to the optical waveguide 8. Further, a first metal wire 16a and a second metal wire 16b are formed on the substrate 2. The first and second metal wires 16a and 16b have micro-bumps 18 that face the first and second electrodes 10a and 10b.

The first and second electrodes 10a and 10b of the optical element 6 and the first and second metal wires 16a and 16b of the substrate 2 are made of, for example, gold (Au). The electrodes 10a, 10b and the metal wires 16a, 16b made of gold (Au) are bonded by, for example, the room-temperature bonding.

According to the room-temperature bonding, the micro-bumps 18 on the first and second metal wires 16a, 16b and the surface of the first and second electrodes 10a, 10b are exposed to argon plasma and activated. The micro-bumps 18 collapse in high pressure and low temperature so that clean surface appears. Each of the micro-bumps 18 is bonded with the first and second electrodes 10a, 10b. As depicted in FIGS. 1A and 1B, a first bonding part 12 includes the first electrode 10a and the first metal wire 16a which are located on one side of the waveguide 8, and a second bonding part 14 includes the second electrode 10b and the second metal wire 16b that are located on the other side of the waveguide 8. By the first and second bonding parts 12, 14, the optical element 6 is bonded with the substrate 2. In this configuration, the first and second bonding parts 12, 14 are not placed directly under the waveguide 8 but on both sides of the waveguide 8. Thus the first and second bonding parts 12, 14 do not receive the weight of the waveguide 8 in the process of the room-temperature bonding.

The first metal wire 16a is electrically connected to the thin film heater 4 via the first bonding part 12. The second metal wire 16b is electrically connected to the thin film heater 4 via the second bonding part 12. Therefore, as current flows between the first metal wire 16a and the second metal wire 16b, current 27 flows through the thin film heater 4 as depicted in FIG. 1B. The thin film heater 4 produces heat that flows to and warms the optical waveguide 8. In this way the temperature is controlled.

As explained above, according to the optical device 20 of Embodiment 1, the first and second bonding parts 12, 14 made of metal material bonds the substrate 2 and the optical element 6, and the thin film heater 4 is electrically connected via the bonding parts. In this way, the optical device 20 according to Embodiment 1 does not require additional lines for the purpose of electrical connection. As a result, an idle area on the optical element 6 is reduced, thereby downsizing the device, and the manufacturing process is simplified.

Embodiment 2

FIGS. 2A, 2B

Figure 2B:
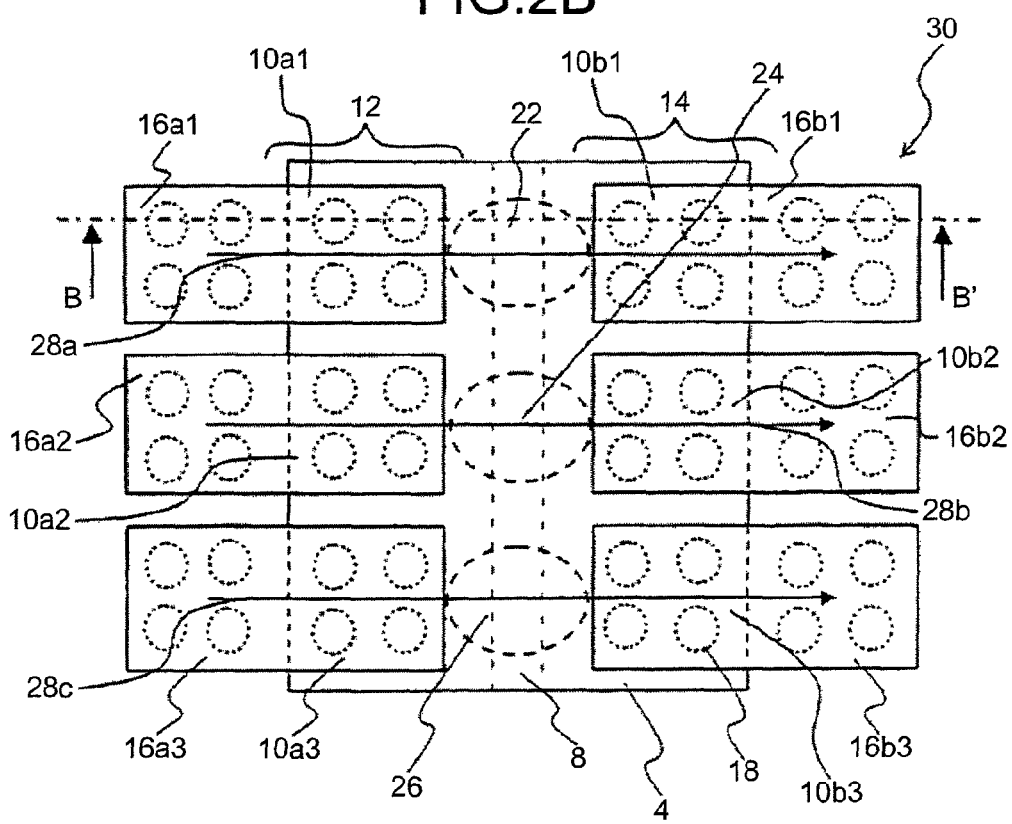
FIG. 2B is a diagram depicting a configuration of an optical device according to Embodiment 2.

An optical device according to Embodiment 2 is explained. FIGS. 2A and 2B are diagrams depicting a configuration of an optical device 30 according to Embodiment 2. FIG. 2A is a section view of the optical device 30. FIG. 2B is a plan view of the optical device 30, looking at the optical device 30 from below, from the bottom in FIG. 2A. For simplicity, FIG. 2B only depicts part of elements of the optical device 30. FIG. 2A is a section view along a line B-B' of FIG. 2B.

Identical components are given the same reference numerals in FIGS. 2A and 2B as Embodiment 1 and overlapping description is omitted hereinafter. The optical device 30 according to Embodiment 2 is fabricated such that the optical element 6 having the optical waveguide 8 for guiding light is bonded with the substrate 2. In comparison with the optical device 20 of Embodiment 1, the optical device 30 of Embodiment 2 has electrodes formed on the optical element 6 and metal wires formed on the substrate 2 in a different manner.

The optical device 30 of Embodiment 2 includes multiple first metal wires (first metal wires 16a1, 16a2, 16a3 in FIG. 2B) formed on the substrate 2. The optical device 30 also includes multiple second metal wires (second metal wires 16b1, 16b2, 16b3 in FIG. 2B) formed on the substrate 2.

The optical device 30, as depicted in FIGS. 2A and 2B, includes multiple first electrodes (first electrodes 10a1, 10a2, 10a3 in FIG. 2B) formed on the thin film heater 4 of the optical element 6. The optical device 30 also includes multiple second electrodes (second electrodes 10b1, 10b2, 10b3 in FIG. 2B) formed on the thin film heater 4 of the optical element 6.

The first metal wires 16a1, 16a2, 16a3 and the second metal wires 16b1, 16b2, 16b3 are formed above the optical element 6 and include micro-bumps 18 that face the first electrodes 10a1, 10a2, 10a3 and the second electrodes 10b1, 10b2, 10b3.

The first electrodes 10a1, 10a2, 10a3, the second electrodes 10b1, 10b2, 10b3, the first metal wires 16a1, 16a2, 16a3, and the second metal wires 16b1, 16b2, 16b3 are made of, for example gold (Au) and are bonded by the room-temperature bonding as depicted in FIGS. 2A and 2B. A first bonding part 12 includes the first electrodes 10a1, 10a2, 10a3 and the first metal wires 16a1, 16a2, 16a3. A second bonding part 14 includes the second electrodes 10b1, 10b2, 10b3 and the second metal wires 16b1, 16b2, 16b3. Via the first and second bonding parts 12, 14, the optical element 6 is bonded with the substrate 2.

The first metal wires 16a1, 16a2, 16a3 are electrically connected with the thin film heater 4 via the first bonding part 12. The second metal wires 16b1, 16b2, 16b3 are electrically connected with the thin film heater 4 via the second bonding part 14. By this configuration, the optical device 30 of Embodiment 2 can partially heat the optical waveguide 8.

For example, as depicted in FIG. 2B, as current 28a flows between the first metal wire 16a1 and the second metal wire 16b1, a region 22 of the thin film heater 4 produces heat so that the corresponding part of the optical waveguide 8 is heated intensively. As current 28b flows between the first metal wire 16a2 and the second metal wire 16b2, a region 24 of the optical waveguide 8 is heated intensively. As current 28c flows between the first metal wire 16a3 and the second metal wire 16b3, a region 26 of the optical waveguide 8 is heated intensively.

Further, as current flows between all the first metal wires 16a1, 16a2, 16a3 and all the second metal wires 16b1, 16b2, 16b3, all regions of the optical waveguide 8 can be heated. Furthermore, as current flows between metal wires diagonally opposite each other, for example between the first metal wire 16a1 and the second metal wires 16b2, instead of between metal wires horizontally facing each other, part of the optical waveguide 8 is heated. In this way, by the selection or combination of metal wires through which current flows, the optical device 30 according to Embodiment 2 can provide the optimal partial heating of the optical waveguide 8.

As depicted in FIGS. 1A, 1B, 2A, and 2B, the optical waveguide 8 is positioned on a plane facing the substrate 2, and the thin film heater 4 is formed above the optical waveguide 8. As a result, the temperature control by the thin film heater 4 for the optical waveguide 8 can be conducted more efficiently than a configuration where an optical waveguide is formed on the opposite side, not facing the substrate 2. In addition, since the optical waveguide 8 faces the substrate 2, the height of the optical element can be adjusted with reference to the upper surface of the substrate 2. As a result, when the optical coupling with a light emitting device such as a laser diode is conducted, the alignment of the height with the light emitting device can be easily done.

Embodiment 3

FIG. 3

Figure 3:
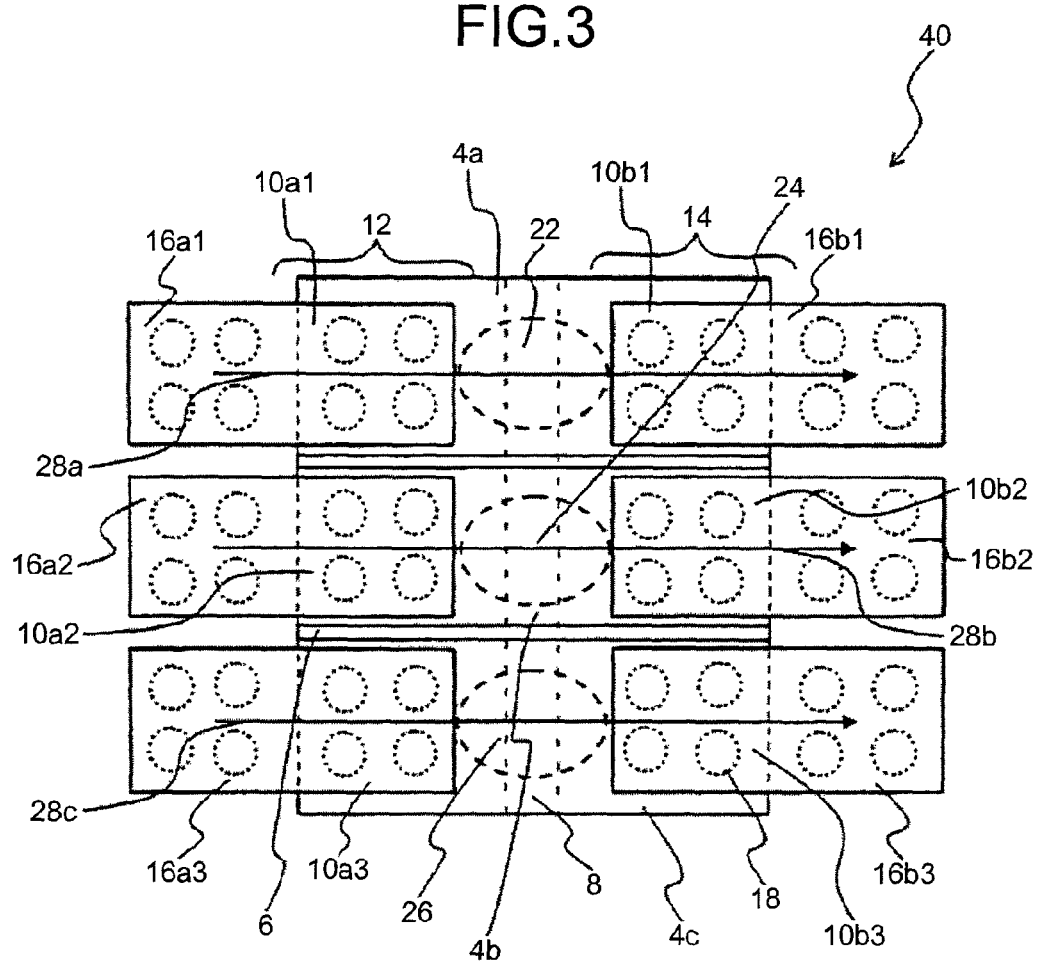
FIG. 3 is a diagram depicting a configuration of an optical device according to Embodiment 3.

An optical device according to Embodiment 3 is explained. FIG. 3 is a diagram depicting a configuration of an optical device 40 according to Embodiment 3. A section view of the optical device 40 according to Embodiment 3 is identical to the section view of the optical device 30 in Embodiment 2 depicted in FIG. 2A and thus is omitted. FIG. 3 is a plan view of the optical device 40 depicting part of elements of the optical device 40.

In FIG. 3, identical components are given the same reference numerals as Embodiment 1 and overlapping description is omitted hereinafter. The optical device 40 according to Embodiment 3 is fabricated such that the optical element 6 having the optical waveguide 8 for the guiding of light is bonded with the substrate 2. When the optical device 40 according to Embodiment 3 is compared with the optical device 30 in Embodiment 2, a shape of the thin film heater 4 above the optical element 6 is different.

Multiple thin film heaters (thin film heaters 4a, 4b, 4c in FIG. 3) are formed above the substrate 2. One of the first electrodes 10a of the first bonding part 12 and one of the second electrodes 10b of the second bonding part 14 are formed on each of the thin film heaters 4a, 4b, 4c. In FIG. 3, the first electrode 10a1 and the second electrode 10b1 are formed on the thin film heater 4a, the first electrode 10a2 and the second electrode 10b2 are formed on the thin film heater 4b, and the first electrode 10a3 and the second electrode 10b3 are formed on the thin film heater 4c.

As explained above, the first metal wire 16a1 is electrically connected with the thin film heater 4a via the first boding part 12, and the second metal wire 16b1 is electrically connected with the thin film heater 4 via the second boding part 14. The second metal wire 16a2 is electrically connected with the thin film heater 4b via the first bonding part 12, and the second metal wire 16b2 is electrically connected with the thin film heater 4b via the second bonding part 14. The first metal wire 16a3 is electrically connected with the thin film heater 4c via the first bonding part 12, and the second metal wire 16b3 is electrically connected with the thin film heater 4c via the second bonding part 14.

In the optical device 40 having the above configuration, current flows, for example, between the first metal wire 16a1 and the second metal wire 16b1 so that current 28a flows only through the region 22 of the thin film heater 4 producing heat and the corresponding region of the optical waveguide 8 is heated. When current flows between the first metal wire 16a2 and the second metal wire 16b2, current 28b flows only through the region 24 of the thin film heater 4 producing heat and the corresponding region of the optical waveguide 8 is heated. When current flows between the first metal wire 16a3 and the second metal wire 16b3, current 28c flows only through the region 26 of the thin film heater 4 producing heat and the corresponding region of the optical waveguide 8 is heated.

When current flows between all the first metal wires 16a1, 16a2, 16a3 and all the second metal wires 16b1, 16b2, 16b3, all the corresponding regions of the optical waveguide 8 are heated. The optical device 40 according to Embodiment 3 includes multiple thin film heaters 4a, 4b, 4c, each of which is connected with the first metal wire 16a and the second metal wire 16b. In comparison with the optical device 30 in Embodiment 2, the optical device 40 can partially heat the optical waveguide 8 more precisely.

In the above embodiments, an optical waveguide formed by the PE method has been taken as an example but the same advantage can be achieved with an optical waveguide formed by other methods. For example, a ridge optical waveguide may be used. To construct the ridge optical waveguide, $LiNbO_3$ itself is processed instead of giving a high refractive index to part of $LiNbO_3$ like the PE method so that the difference between refractive indexes of $LiNbO_3$ and ambient air guides light.

Embodiment 4-1

FIG. 4

Figure 4:
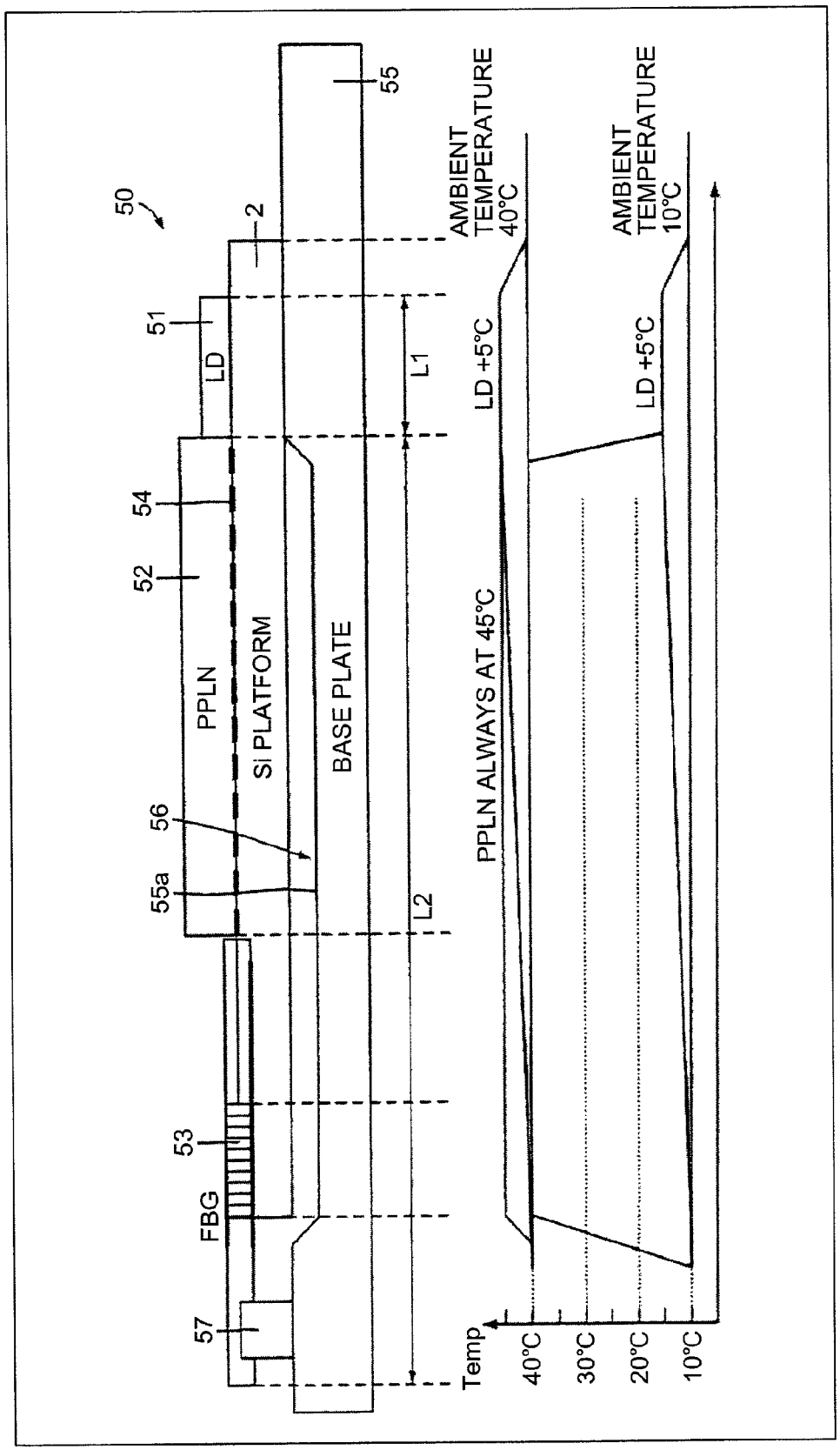
FIG. 4 is a diagram depicting a front view of an optical device of Embodiment 4.

An optical device according to Embodiment 4 is explained. FIG. 4 is a diagram depicting a front view of an optical device 50 of Embodiment 4. Embodiment 4 explains a temperature control of an optical element. On the substrate 2, multiple optical elements, a laser diode (LD) 51, a wavelength conversion element (PPLN) 52, and a fiber bragg grating (FBG) 53 are mounted. As depicted in the figure, the thin film heater 4 is disposed below the wavelength conversion element 52. The substrate 2 is made of, for example, silicon (Si). The substrate 2 is mounted above a base substrate 55 that is made of metal conducting heat well.

The temperature control according to FIG. 4 performs:
(1) fixing temperature of an optical element on the substrate 2 in order for the wavelength to be the same at the wavelength conversion element 52 and the FBG 53;
(2) releasing heat produced from the LD 51 to the outside and keeping the temperature at +5° C. compared with the outside ambient temperature;
(3) keeping heating an optical element with the thin film heater 4 up to +5° C. compared with the maximum ambient temperature.

For these purposes, the base substrate 55 is bonded to the substrate 2 with an inventive way. The base substrate 55 is bonded to part of the substrate 2 having the length of L1, the length of the LD 51. The LD 51 is mounted on that part of the substrate 2. Part of the substrate 2 above which the wavelength conversion element 52 and the FGB 53 are mounted is adiabatically isolated by space 56 that is present between the substrate 2 and the base substrate 55 with the length of L2. More specifically, a low portion 55a is formed on the base substrate 55 by, for example, a grinding process so that the low portion 55a does not contact the substrate 2. At one end of the FBG 53, a support 57 that conducts heat well is disposed. The support 57 supports the FBG 53. The support 57 may be a thermal insulator instead of a high thermal conductive material depending on the design for heat control.

According to the configuration above, heat from the LD 51 is directly transferred from the substrate 2 to the base substrate 55 or dissipates only in the longitudinal direction of the substrate 2. A resultant temperature gradient in the longitudinal direction of the substrate 2 (the horizontal direction in the figure) is depicted in the figure. For example, assume that the temperature of the LD 51 is adjusted to 45° C. by heat dissipation under the ambient temperature of 40° C. Heat from the LD 51 flows in the longitudinal direction of the substrate 2 and the temperature gradually decreases. The thin film heater 4 warms up the wavelength conversion element 52 and maintains the temperature of the wavelength conversion element 52 at 45° C. compensating the temperature gradient.

According to the temperature control above, a simple structure of the base substrate 55 having a low portion 55a enables the maintenance of a predetermined constant temperature of optical elements (LD 51, wavelength conversion element 52, FBG 53) above the substrate 2.

Embodiment 4-2

FIG. 5

Figure 5:
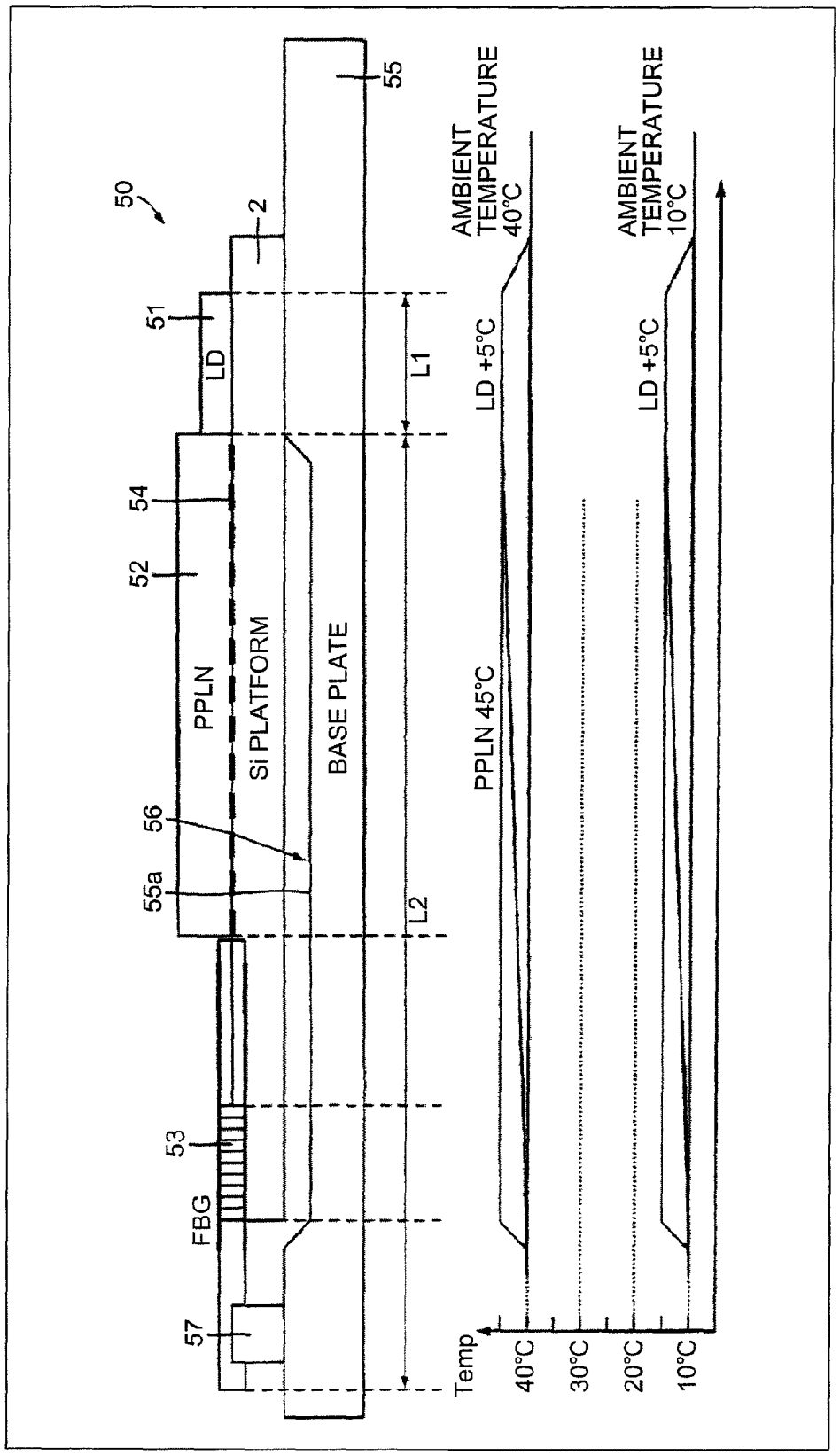
FIG. 5 is a front view of another optical device according to Embodiment 4.

An optical device according to another example of Embodiment 4 is explained. FIG. 5 is a front view of another optical device according to Embodiment 4. The structure of the optical device in FIG. 5 is identical to that in FIG. 4. The temperature control method is different.

The temperature control according to FIG. 5 performs:
(1) dissipating heat produced from the LD 51 to the outside and keeping the temperature at +5° C. compared with the outside ambient temperature;
(2) keeping the temperature of the wavelength conversion element 52 and the FGB 53 at +5° C. compared with the temperature of the LD;
(3) performing a corrective heating of the wavelength conversion element 52 by the thin film heater 4 so that the wavelength of the FBG 53 is identical to that of the converted wavelength at the wavelength conversion element 52. The wavelength at the FBG 53 is selected beforehand such that the wavelength at the FBG 53 matches the converted wavelength at the wavelength conversion element 52 only by the heating.

According to the temperature control above, a simple structure of the base substrate 55 having a low portion 55a enables the maintenance of a predetermined constant temperature of optical elements (LD 51, wavelength conversion element 52, FBG 53) above the substrate 2. Further, the temperature of the optical device 50 can be controlled based on the ambient temperature.

Embodiment 4-3

FIG. 6, FIGS. 7A to 7C

Figure 6:
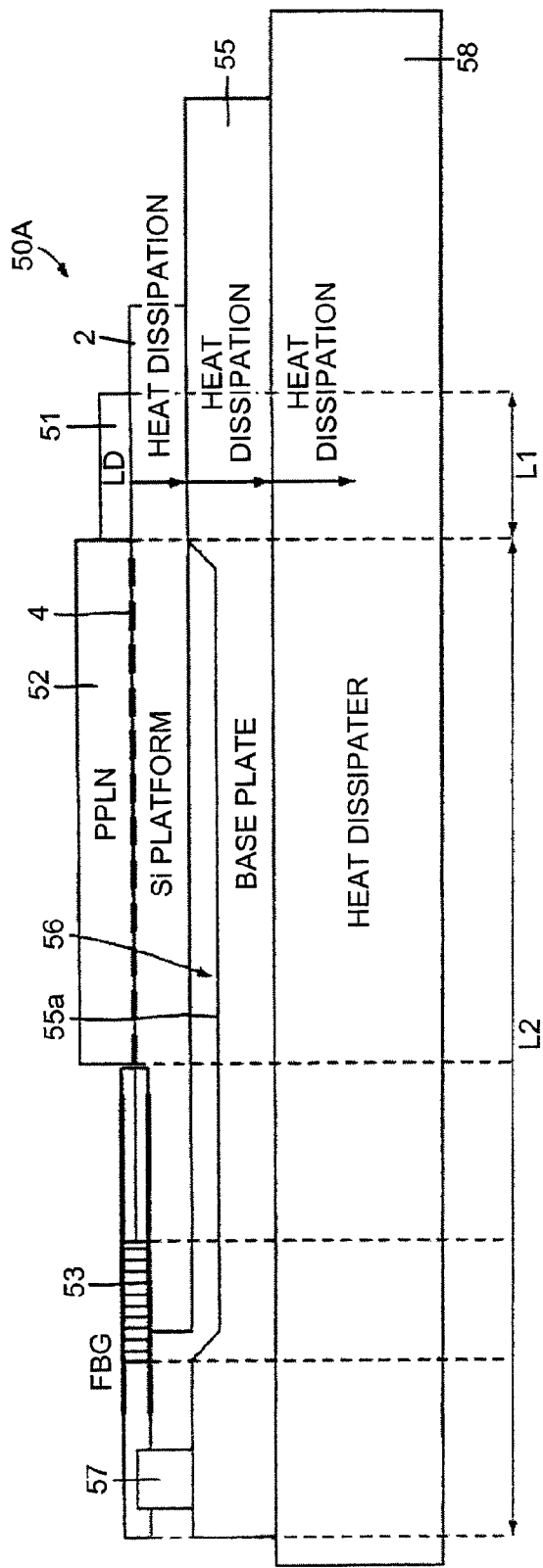
FIG. 6 is a front view of another optical device according to Embodiment 4.

An optical device according to another example of Embodiment 4 is explained. FIG. 6 is a front view of an optical device 50A according to Embodiment 4. According to FIG. 6, heat from the LD 51 is released to the outside as much as possible. In comparison with FIG. 5, a structure of FIG. 6 has the thin film heater 4 under both the wavelength conversion element 52 and the FBG 53. The bottom surface of the base substrate 55 is bonded to a heat dissipator 58 that stays in the ambient temperature. Thus the heat from the LD 51 flows to the heat dissipator 58 through via the substrate 2 and dissipates to the external environment via the heat dissipator 58.

Figure 7A:
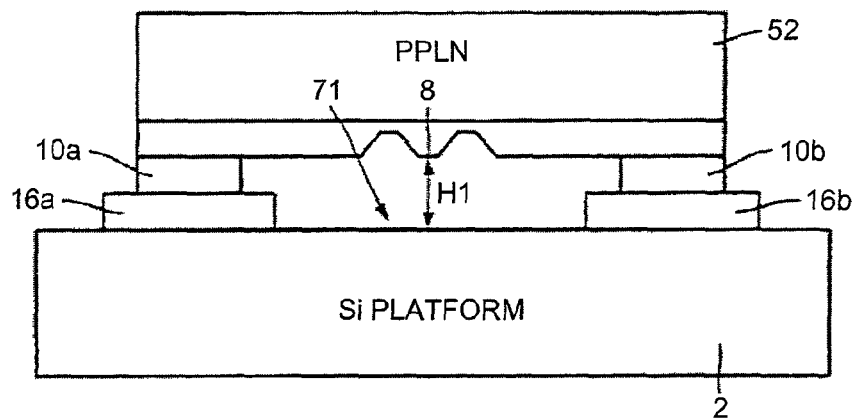
FIG. 7A is a side view depicting a junction of a wavelength conversion element and a substrate.
Figure 7B:
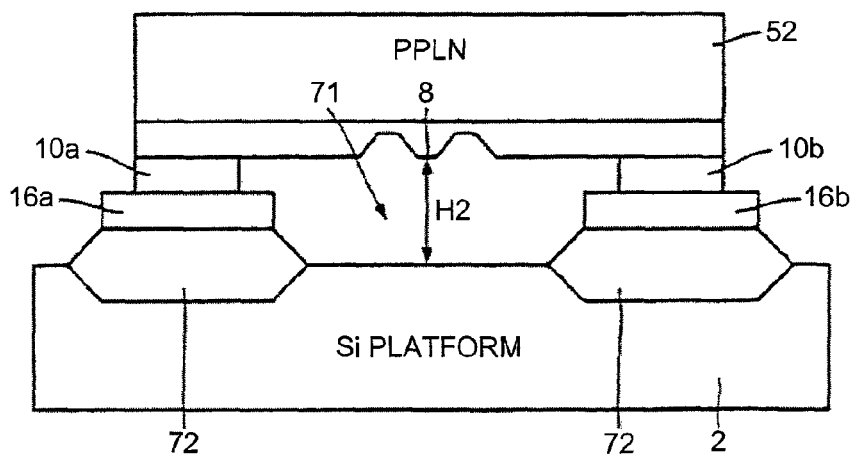
FIG. 7B is a side view depicting a junction of the wavelength conversion element and the substrate.
Figure 7C:
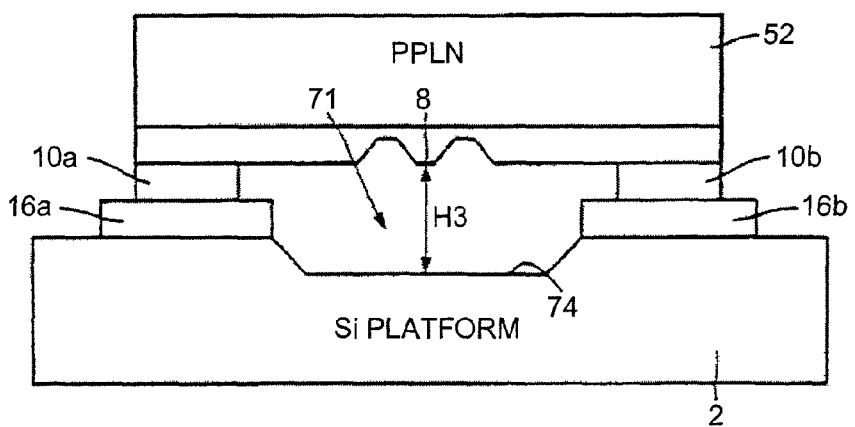
FIG. 7C is a side view depicting a junction of the wavelength conversion element and the substrate.

FIGS. 7A to 7C are side views of a junction structure of the wavelength conversion element 52 and the substrate 2. As depicted in the figures, space between the wavelength conversion element 52 and the substrate 2 enables heat insulation. Structures depicted in FIGS. 7A to 7C keep the wavelength conversion element 52 at a constant, high temperature.

According to FIG. 7A, space 71 extends up to the height of H1, the height of the first electrode 10a plus the first metal wire 16a (the second electrode 10b and the second metal wire 16b). According to FIG. 7B, oxide films 72 are formed at the place of the first metal wire 16a and the second metal wire 16b on the substrate 2. As a result, the height of the space 71 reaches the height of H2, the height of the oxide film 72 plus H1. According to FIG. 7C, a low portion 74 is formed between the first and second metal wires 16a, 16b on the substrate 2 by, for example, the etching process. The height of the space 71 reaches the height of H3, the depth of the low portion 74 plus H1. According to these configurations, a higher space 71 is obtained and the thermal insulation from the substrate 2 is realized.

Embodiment 5

Figure 8A:
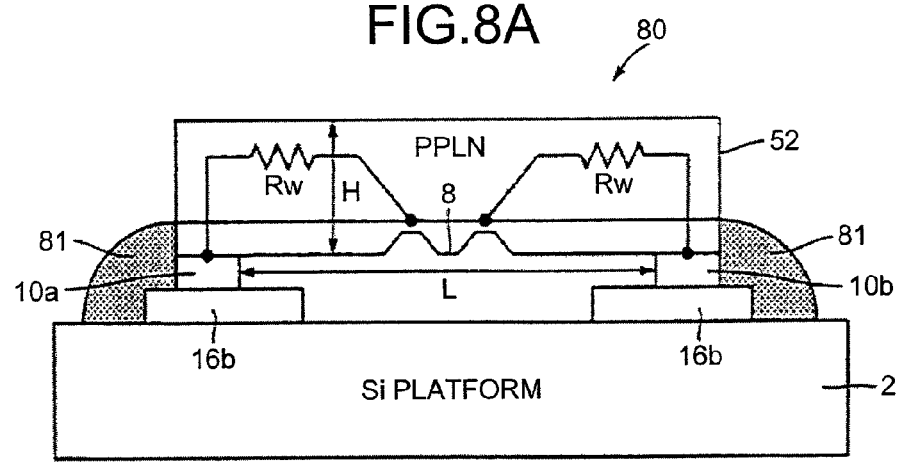
FIG. 8A is a side view of an optical device according to Embodiment 5.
Figure 8B:
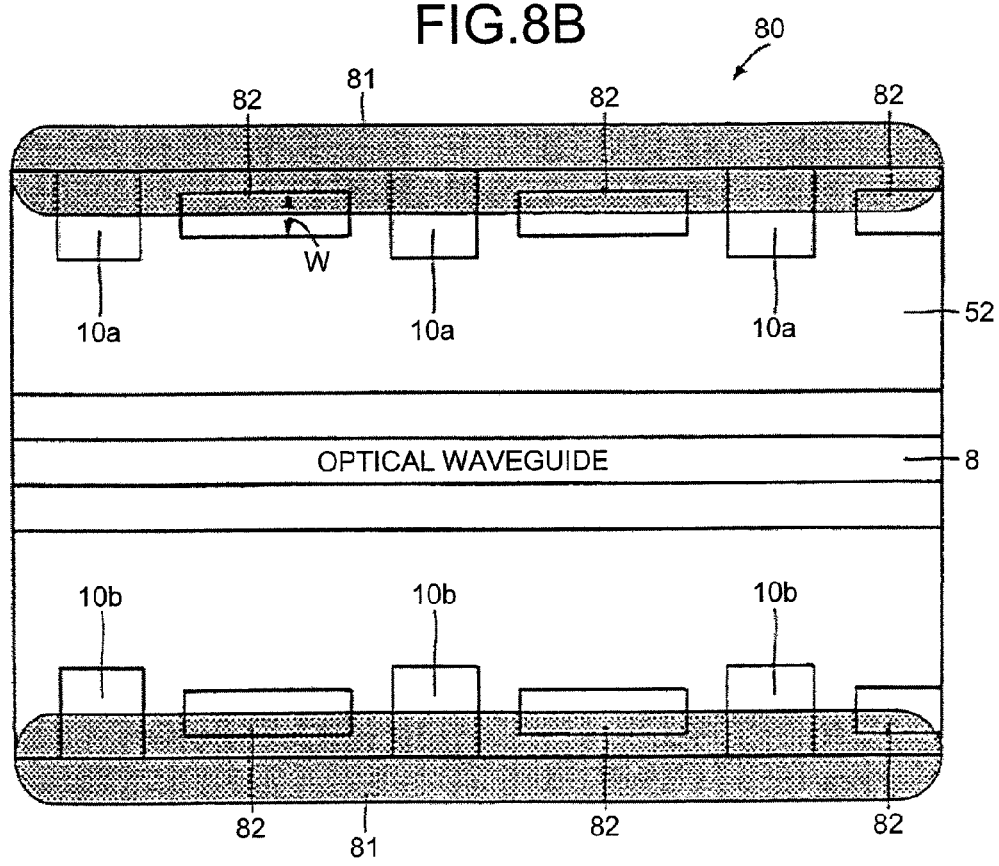
FIG. 8B is a top view of the optical device depicted in FIG. 8A.
Figure 8C:
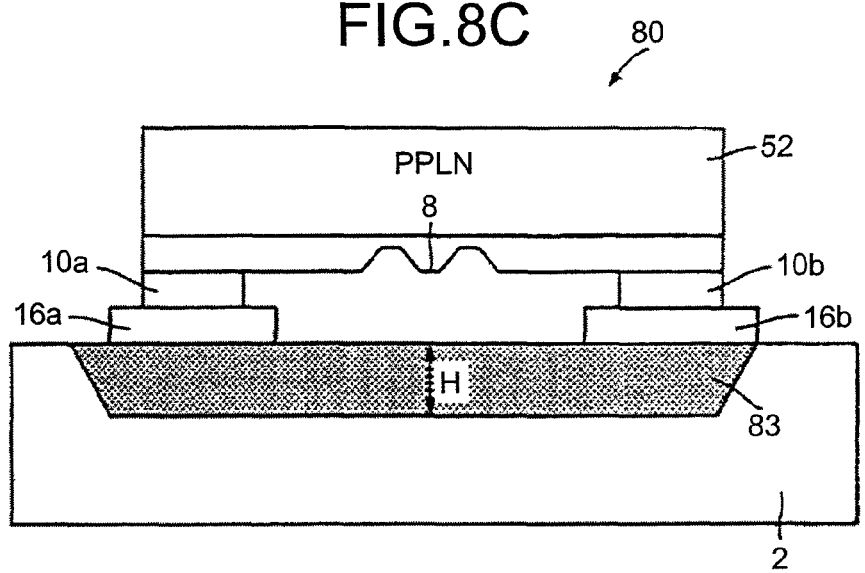
FIG. 8C is a side view of another optical device according to Embodiment 5.

FIGS. 8A to 8C

An optical device according to Embodiment 5 is explained with reference to FIGS. 8A to 8C. In Embodiment 5, thermal resistance Rw is added on the sides (both sides with the optical waveguide 8 residing on a center part) of the wavelength conversion element 52. According to the structures depicted in FIGS. 8A to 8C, the wavelength conversion element 52 is kept at a constant, high temperature.

FIG. 8A is a side view of an optical device 80 according to Embodiment 5. The first electrode 10a and the second electrode 10b, a fixing unit of an optical device, are disposed on both sides of the wavelength conversion element 52. The distance L between the first electrode 10a and the second electrode 10b is stretched. The height H of the wavelength conversion element 52 is lowered. This structure increases thermal resistance along a path to the optical waveguide 8 disposed at the center part and thermally isolates the optical waveguide 8.

FIG. 8B is a top view of the optical device 80 depicted in FIG. 8A. As can be seen, a boding part between the substrate 2 and the wavelength conversion element 52 is divided. Seen from the top, first electrodes 10a and second electrodes 10b are formed intermittently along the longitudinal direction of the optical waveguide 8. In the figure, the first electrodes 10a and the second electrodes 10b in a rectangular form are apart from each other along the longitudinal direction of the optical waveguide 8 and are connected with the first metal wire 16a and the second metal wire 16b on the substrate 2. Dividing the first electrodes 10a and the second electrodes 10b reduces an area of the bonding part through which heat flows to the substrate 2.

According to the above structure, the area of the first electrodes 10a and the second electrodes 10b against the substrate 2 is reduced and thus adhesive 81 having low heat conductivity is used to bond both sides of the wavelength conversion element 52 with the substrate 2 along the longitudinal direction. As a result, the bonding between the wavelength conversion element 52 and the substrate 2 is strengthened. Inrush prevention walls 82 made of the same metal (Au) as the first and second electrodes 10a, 10b are formed between the first electrodes 10a (the second electrodes 10b). The inrush prevention walls 82 are electrically isolated and formed together with the first and second electrodes 10a, 10b by, for example, the etching. The inrush prevention walls 82 prevent the inrush of the adhesive 81 into the inside (towards the optical waveguide 8 in FIG. 8B). The width W of the inrush prevention walls 82 is made as thin as possible so that heat transfer is reduced.

As a modified embodiment of Embodiment 5, the oxide film 72 of FIG. 7B may be added into FIG. 8B so that the space between the wavelength conversion element 52 and the substrate 2 is increased and the thermal resistance is increased.

FIG. 8C is a side view of the optical device 80 according to another example of Embodiment 5. According to the figure, a nanocrystal unit 83 that is microcrystalline, porous silicon is formed with a given height H (about 10 μm) on the substrate 2 made of silicon. Above the nanocrystal unit 83, the first metal wire 16a and the second metal wire 16b are formed. The nanocrystal unit 83 increases thermal resistance.

Embodiment 6

FIGS. 9A to 9C

An optical device 90 according to Embodiment 6 is explained with reference to FIGS. 9A to 9C. In Embodiment 6, thermal resistance RL in the longitudinal direction of the substrate 2 (along the optical axis of the optical waveguide 8) is increased. FIG. 9A is a front view of the optical device 90 according to Embodiment 6. In FIG. 9A, like FIG. 6, the base substrate 55 is bonded to part of the substrate 2 having the length of L1, the length of the LD 51. Part of the substrate 2 above which the wavelength conversion element 52 and the FBG 53 are mounted is thermally insulated by space 56 that is present between the substrate 2 and the base substrate 55 with the length of L2. AT one end of the FBG 53, the support 57 that conducts heat well is disposed. The support 57 supports the FBG 53. A support element 91 made up of thermal insulation material is disposed on the base substrate 55, at one end of the substrate 2, and supports the end of the substrate 2. The substrate 2 is thinly formed by for example the etching. The LD 51 releases heat through the substrate 2 and the base substrate 55 to the heat dissipator 58. The support element 91 may have high or low thermal conductivity depending on the design for thermal controlling.

FIG. 9B is a front view of the optical device 90 according to another example of Embodiment 6. For simplicity, only the substrate 2 is depicted. Trenches 92 are formed on the bottom surface of the substrate 2. The trenches do not penetrate the substrate 2 maintaining the substrate's strength. The opening of the trenches 92 may take various forms such as a circle, a square, and so on.

FIG. 9C is a front view of the optical device 90 according to another example of Embodiment 6. On the bottom surface of the substrate 2, a low portion 93 is formed. The low portion 93 is formed by hollowing out the substrate 2 with the brim of the substrate left for maintaining the strength of the substrate 2. With the structures depicted in FIGS. 9A to 9C, thermal resistance of the substrate 2 is heightened and the wavelength conversion element 52 is kept at a high, constant temperature.

Embodiment 7

FIG. 10A, FIG. 10B

Figure 10B:
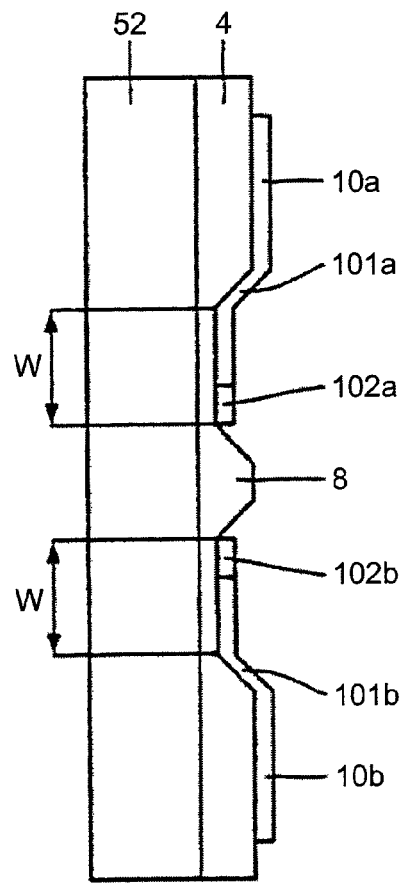
FIG. 10B is a side view of the heater.

An optical device 100 according to Embodiment 7 is explained. In Embodiment 7, a heater warms part that is close to the optical waveguide 8. FIG. 10A is a plan view of a heater and FIG. 10B is a side view of the heater. Multiple first electrodes 10a and the second electrodes 10b made of Au are arranged (see FIG. 8B). Connectors 101a made of Au stick out from the first electrodes 10a towards the optical waveguide 8. At the head of the connectors 101a disposed are heaters 102a that are made of Au and running in parallel with the optical waveguide 8. In a similar manner, connectors 101b made of Au stick out from the second electrodes 10b towards the optical waveguide 8. At the head of the connectors 101b disposed are heaters 102b that are made of Au and running in parallel with the optical waveguide 8.

In the configuration above, the optical waveguide 8 is formed at a ridge of a convex shape but the place of the optical waveguide 8 is not limited to this configuration. In the example above, the connectors 101a, 101b are extended to concave portions located on both sides of the ridge. As a result, the heaters 102a, 102b are placed close to the optical waveguide 8 and can directly heat the optical waveguide 8.

The first electrodes 10a and the second electrodes 10b that are electrodes for the wavelength conversion element 52 are shared as the electrodes for the heaters 102a, 102b. The heaters 102a, 102b are made of the same material as the electrodes. The optical waveguide 8 can be efficiently heated from up close and kept at a constant temperature. Further, since the first electrode 10a, the second electrode 10b, the connectors 101a, 101b, the heater 102a, and the heater 102b are made of the same material (for example, Au), the pattern can easily be formed. The function of heater is realized by the same material as the electrodes. Additional electrodes need not be prepared for the heaters 102a, 102b.

A resistance value can be adjusted to be appropriate for the pulse width modulation control of for example 5V by changing the size of the pattern at the pattern forming process. For the heaters 102a, 102b of Au thin films, when the length L=1 mm and the cross-section A=2 μm×0.5 μm, heater resistance=R=ρL/A=23.5Ω, resistance ratio of Au ρ=2.35×$10^{-8}$ Ωm, L=1×$10^{-3}$ m, A=2×0.5×$10^{-12}$ $m^2$. Thus, when 5V is applied at the pulse width modulation, 1.06 W is obtained at 235 mA. Therefore, the length of the connectors 101a, 101b is set at about 2 mm.

Figure 10C:
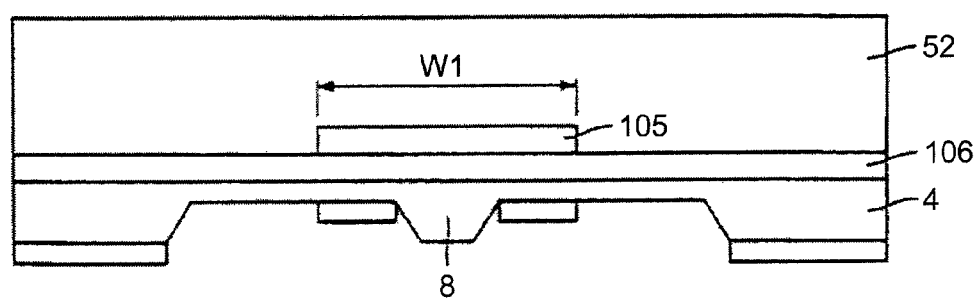
FIG. 10C is a side view of an electrode for polarization inversion.

FIG. 10C is a side view of an electrode for polarization inversion. An electrode 105 for polarization conversion does not extend to the full length of the wavelength conversion element 52 but have a length W1 with reference to the ridge of the optical waveguide 8. The electrode 105 for polarization inversion is made up of ITO film. Reference numeral 106 indicates an bonding layer. In this way, the electrode 105 shows lower heat conductance.

Figure 11A:
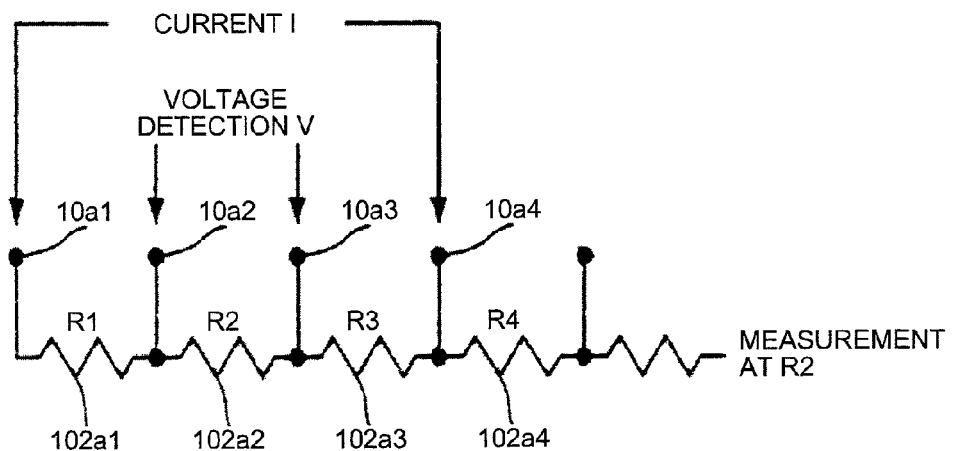
FIG. 11A is a diagram depicting detection of voltage applied to a heater using electrodes.
Figure 11B:
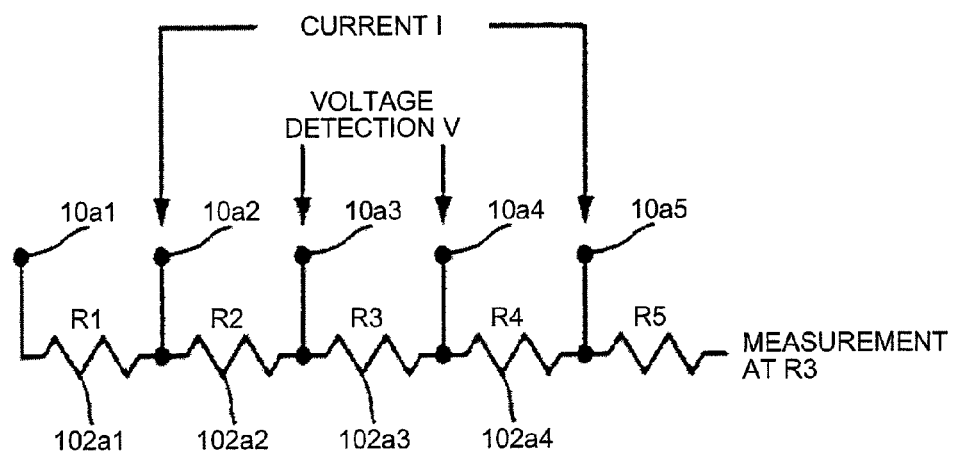
FIG. 11B is a diagram depicting detection of voltage applied to a heater using electrodes.

FIG. 11A and FIG. 11B are diagrams depicting the detection of voltage applied to a heater using electrodes. The first electrodes 10a and the second electrodes 10b enable a temperature control at each of blocks. Voltage between electrodes can precisely be measured by a general four-terminal method as depicted in the figure. Here the first electrodes 10a are taken as an example. For instance, as can be seen in FIG. 11A, in order to measure voltage applied to a heater 102a2 (R2), voltage V between a pair of first electrodes 10a2, 10a3 is measured. At this time, current is supplied from electrodes 10a1 and 10a4 located next to the electrodes 10a2, 10a3. In a similar manner, as depicted in FIG. 11B, in order to measure voltage applied to a heater 102a3 (R3), voltage V between a pair of first electrodes 10a3, 10a4 is measured. At this time, current is supplied from electrodes 10a2, 10a5 located next to electrodes 10a3, 10a4.

INDUSTRIAL APPLICABILITY

An optical device according to the present invention includes a waveguide for guiding light and has functions of both mounting and temperature control at a minimal mounting area. Thus the optical device can be applied to another device that requires a smaller mounting area and a temperature control, reducing the size of the device.

EXPLANATIONS OF LETTERS OR NUMERALS 2 substrate
4, 4a, 4b, 4c thin film heater
6 optical element
8 optical waveguide
10a, 10a1, 10a2, 10a3 first electrodes
10b, 10b1, 10b2, 10b3 second electrodes
12 first bonding part
14 second bonding part
16a, 16a1, 16a2, 16a3 first metal wire
16b, 16b1, 16b2, 16b3 second metal wire
18 micro-bump
20, 30, 40 optical device
22, 24, 26 region
27, 28a, 28b, 28c applied current
51 laser diode (LD)
52 wavelength conversion element
53 fiber bragg grating
55 base substrate
55a low portion
56 space
57 support
58 heat dissipater
101a, 101b connector
102a, 102b heater

The invention claimed is:

1. An optical device in which an optical element having an optical waveguide is bonded with a substrate, the optical device wherein
the optical waveguide and a thin film heater that heats the optical waveguide are formed on a surface of an optical element facing the substrate,
the optical element and the substrate are bonded through a first bonding part and a second bonding part made up of metal,
a wire on the substrate is electrically connected with the thin film heater through the first bonding part and the second bonding part, and
the first bonding part and the second bonding part are located on both sides of the optical waveguide.

2. The optical device according to claim 1, comprising:
a first electrode and a second electrode formed on the thin film heater; and
a first metal wire and a second metal wire formed on the substrate,
wherein the first bonding part includes the first electrode and the first metal wire, and
the second bonding part includes the second electrode and the second metal wire.

3. The optical device according to claim 2, comprising
a plurality of first electrodes, a plurality of second electrodes, a plurality of first metal wires, and a plurality of second metal wires,
wherein the first bonding part includes the first electrodes and the first metal wires, and
the second bonding part includes the second electrodes and the second metal wires.

4. The optical device according to claim 2, wherein
a plurality of thin film heaters are formed on the optical element, and
any one among the first electrode and the second electrode is formed on each thin film heater.

5. The optical device according to claim 1, wherein the metal is Au.

6. The optical device according to claim 1, wherein the bonding part includes a micro-bump.

7. The optical device according to claim 1, wherein the substrate and the optical element are bonded by surface activated bonding through the bonding part.

8. The optical device according to claim 1, wherein the thin film heater is made up of a transparent electrode.

9. The optical device according to claim 8, wherein the thin film heater is made up of a film of indium tin oxide, zinc oxide, tin oxide, or impurity-doped zinc oxide or tin oxide.

10. The optical device according to claim 1, wherein the optical element is a wavelength conversion element that converts wavelength of light passing through the optical waveguide.

11. The optical device according to claim 1, comprising a base substrate that is made of material of high heat conductivity and on which the substrate is mounted,
wherein
the substrate includes a laser diode, an optical waveguide that guides light emitted from the laser diode, a wavelength conversion element that converts wavelength of light passing through the optical waveguide, and a fiber bragg grating, arranged in a direction of the optical axis of the optical waveguide,
the base substrate is bonded with the substrate partially where the laser diode is mounted, space is formed between the base substrate and the substrate corresponding to position of the wavelength conversion element and the fiber bragg grating, and a support having high heat conductivity supports the fiber bragg grating, supporting the substrate.

12. The optical device according to claim 10, wherein the first electrode and the second electrode are located on both ends of the wavelength conversion element respectively with respect to the optical waveguide.

13. The optical device according to claim 2, wherein the substrate includes an oxide film having a given height at a position corresponding to the first metal wire and the second metal wire, expanding space between the substrate and the wavelength conversion element.

14. The optical device according to claim 2, wherein the substrate includes a porous part at a position corresponding to the first metal wire and the second metal wire, reducing heat conductivity.

15. The optical device according to claim 13, wherein a plurality of first electrodes and second electrodes are arranged along the optical waveguide, an inrush prevention wall is disposed between the first electrodes and between the second electrodes, is made of the same material as the first electrodes and the second electrodes, and is electrically isolated from the first electrodes and the second electrodes, and the inrush prevention wall prevents inrush of adhesive that fixes the wavelength conversion element to the substrate.

16. The optical device according to claim 1, wherein a bottom surface of the substrate includes trenches that do not penetrate the substrate.

17. The optical device according to claim 1, wherein a bottom surface of the substrate includes a low portion formed by hollowing out the substrate with brim of the substrate left.

18. The optical device according to claim 11, wherein the wavelength conversion element includes:

a heater arranged in parallel with the optical waveguide; and a connector that connects the first electrode and the second electrode with the heater, wherein the connector is made of the same material as the first electrode and the second electrode, the first electrode and the second electrode are connected with the first metal wire and the second metal wire respectively, and the first electrode and the second electrode are used as an electrode for the heater.

* * * * *